United States Patent
Anand et al.

(10) Patent No.: US 6,944,090 B2
(45) Date of Patent: Sep. 13, 2005

(54) METHOD AND CIRCUIT FOR PRECISE TIMING OF SIGNALS IN AN EMBEDDED DRAM ARRAY

(75) Inventors: Darren L. Anand, Essex Junction, VT (US); John A. Fifield, Underhill, VT (US); Harold Pilo, Underhill, VT (US)

(73) Assignee: International Business Machines Corporation, Armonk, NY (US)

( * ) Notice: Subject to any disclaimer, the term of this patent is extended or adjusted under 35 U.S.C. 154(b) by 73 days.

(21) Appl. No.: 10/604,184

(22) Filed: Jun. 30, 2003

(65) Prior Publication Data

US 2005/0007866 A1 Jan. 13, 2005

(51) Int. Cl.$^7$ ................................................ G11C 8/00
(52) U.S. Cl. ...................... 365/233; 365/194; 365/225.7
(58) Field of Search ................................ 365/233, 194, 365/225.7, 203

(56) References Cited

U.S. PATENT DOCUMENTS 5,663,921 A * 9/1997 Pascucci et al. ............ 365/233

* cited by examiner

*Primary Examiner*—David Lam
(74) *Attorney, Agent, or Firm*—Schmeiser, Olsen & Watts; Robert A. Walsh

(57) ABSTRACT

A method and circuit for timing the start of a precharge period in an eDRAM. The circuit including: a delayed lock loop circuit for receiving a clock signal and generating a control signal for adjusting an internal delay of the clock signal; and means for generating a delayed clock signal in response to the control signal. The means for generating the delayed clock signal is a multiple stage delay circuit, each stage of the multiple delay stage circuit connected in series and each stage individually responsive to the control signal.

30 Claims, 6 Drawing Sheets

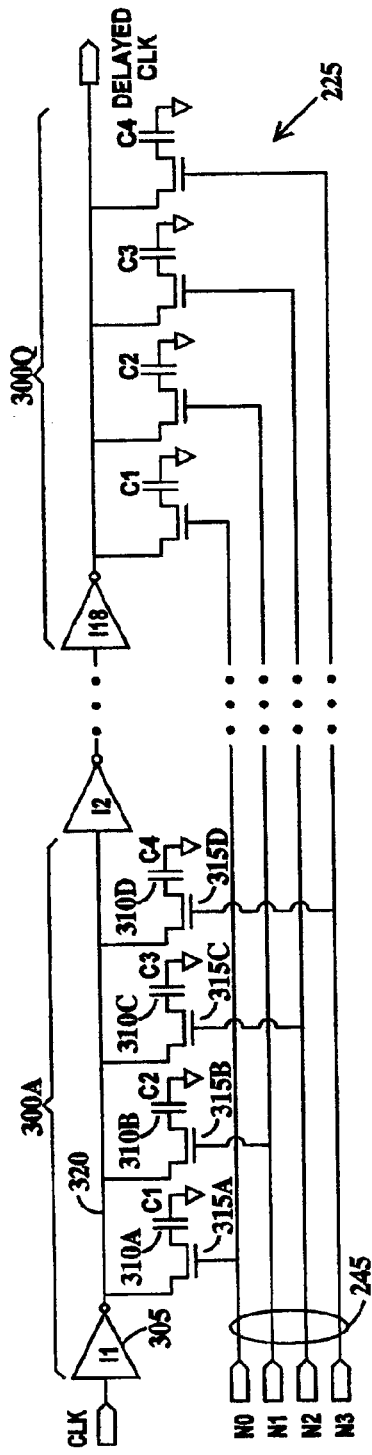
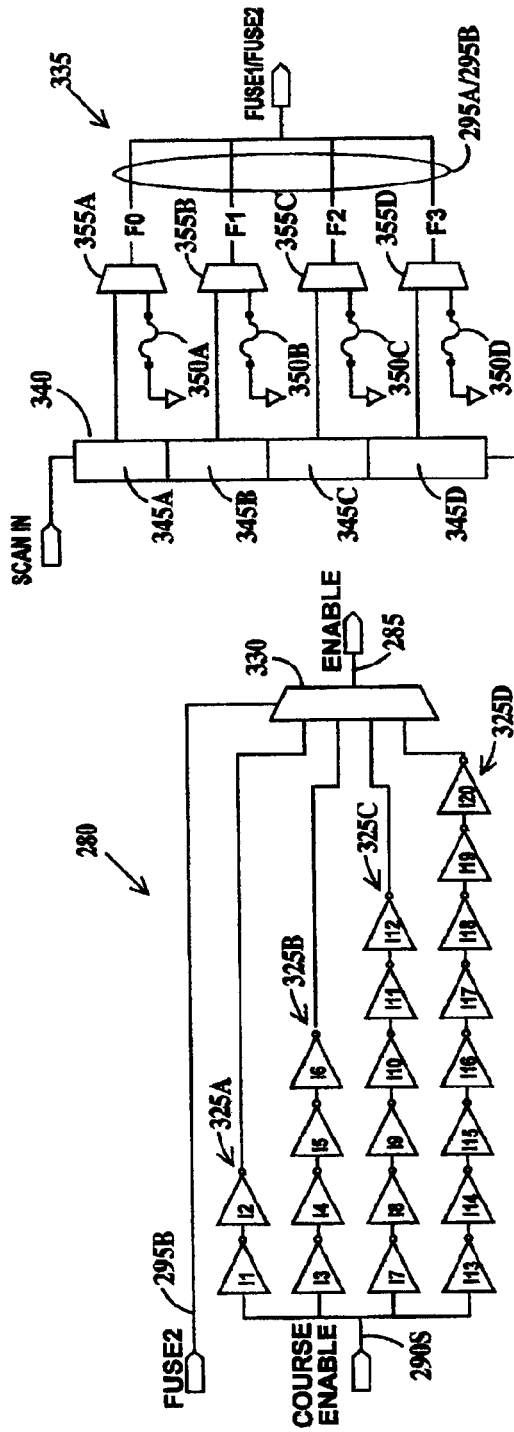
FIG. 4
FIG. 5
FIG. 6

METHOD AND CIRCUIT FOR PRECISE TIMING OF SIGNALS IN AN EMBEDDED DRAM ARRAY

BACKGROUND OF INVENTION

1. Field of the Invention

The present invention relates to the field of integrated circuits; more specifically, it relates to a circuit and a method for precise timing of signals in an embedded dynamic access memory array (eDRAM).

2. Background of the Invention

As eDRAM operational frequencies continue to increase, the duration of the precharge period is scaling faster than the duration of the active period of the read/write cycle making it more difficult to time the start of the precharge period. This can result in insufficient signal development for subsequent read cycles and/or a decrease in data retention.

SUMMARY OF INVENTION

A first aspect of the present invention is a circuit for timing the start of a precharge period in an eDRAM comprising: a delayed lock loop circuit for receiving a clock signal and generating a control signal for adjusting an internal delay of the clock signal; and means for generating a delayed clock signal in response to the control signal.

A second aspect of the present invention is a method for timing the start of a precharge period in an eDRAM comprising: providing a delayed lock loop circuit for receiving a clock signal and generating a control signal for adjusting an internal delay of the clock signal; and providing means for generating a delayed clock signal in response to the control signal.

A third aspect of the present invention is an eDRAM comprising: an array of memory cells interconnected by wordlines and bitlines; a delayed lock loop circuit for receiving a clock signal and generating a control signal for adjusting an internal delay of the clock signal; means for generating first, second, third and fourth delayed clock signals in response to the control signal; a wordline driver for activating wordlines in the eDRAM in response to an address signal, the wordline driver responsive to the third delayed clock signal; a sense amplifier circuit for amplifying data signals on the bitlines, the sense amplifier circuit responsive to the first delayed clock signal and the second delayed clock signal; a bitline precharge circuit for precharging the bitlines, the bitline recharge circuit responsive to the third delayed clock; and a column select circuit for selecting particular bitlines to connect to means for outputting data signals from the array, the column select circuit responsive to the second delayed clock signal and the means for outputting data signals responsive to the fourth delayed clock signal.

A fourth aspect of the present invention is a method of synchronous control of an eDRAM comprising an array of memory cells interconnected by wordlines and bitlines, the method comprising: providing a delayed lock loop circuit for receiving a clock signal and generating a control signal for adjusting an internal delay of the clock signal; providing means for generating first, second, third and fourth delayed clock signals in response to the control signal; providing a wordline driver for activating wordlines in the eDRAM in response to an address signal, the wordline driver responsive to the third delayed clock signal; providing a sense amplifier circuit for amplifying data signals on the bitlines, the sense amplifier circuit responsive to the first delayed clock signal and the second delayed clock signal; providing a bitline precharge circuit for precharging the bitlines, the bitline recharge circuit responsive to the third delayed clock; and providing a column select circuit for selecting particular bitlines to connect to means for outputting data signals from the array, the column select circuit responsive to the second delayed clock signal and the means for outputting data signals responsive to the fourth delayed clock signal.

BRIEF DESCRIPTION OF DRAWINGS

The features of the invention are set forth in the appended claims. The invention itself, however, will be best understood by reference to the following detailed description of an illustrative embodiment when read in conjunction with the accompanying drawings, wherein:

FIG. 4 is a schematic diagram of an exemplary delay element of the circuit of FIG.3;

FIG. 5 is a schematic diagram of an exemplary fine-tuning circuit of the circuit of FIG. 3;

FIG. 6 is a schematic diagram of an exemplary fuse bank for generating control signals for the circuit of FIG. 3;

DETAILED DESCRIPTION

The term and symbol $V_{DD}$ indicates the logic high voltage and logic and array signals swing between $V_{DD}$ and ground unless otherwise noted. The term and symbol $V_{REFX}$ indicates reference cell precharge voltage, which, in one example, has a value equal to the value of $V_{DD}/2$. The term storage capacitor may be read as storage node, since the present invention is not necessarily limited to capacitive storage devices. The terms precharge and restore are equivalent terms and the terms timing and clocking are equivalent terms. A timing phase or a clock phase refers to a portion of a whole clock cycle from a high to the next high or from a low to the next low being 360°. For example, a phase of 90° is a quarter of a clock cycle, a phase of 180° is half a clock cycle and a phase of 270° is three-quarters of a clock cycle. A delay in a synchronous signal is a phase shift of that signal and the terms delay and phase shift may be used interchangeably. Delay may be in units of time or degrees of phase.

Figure 1:
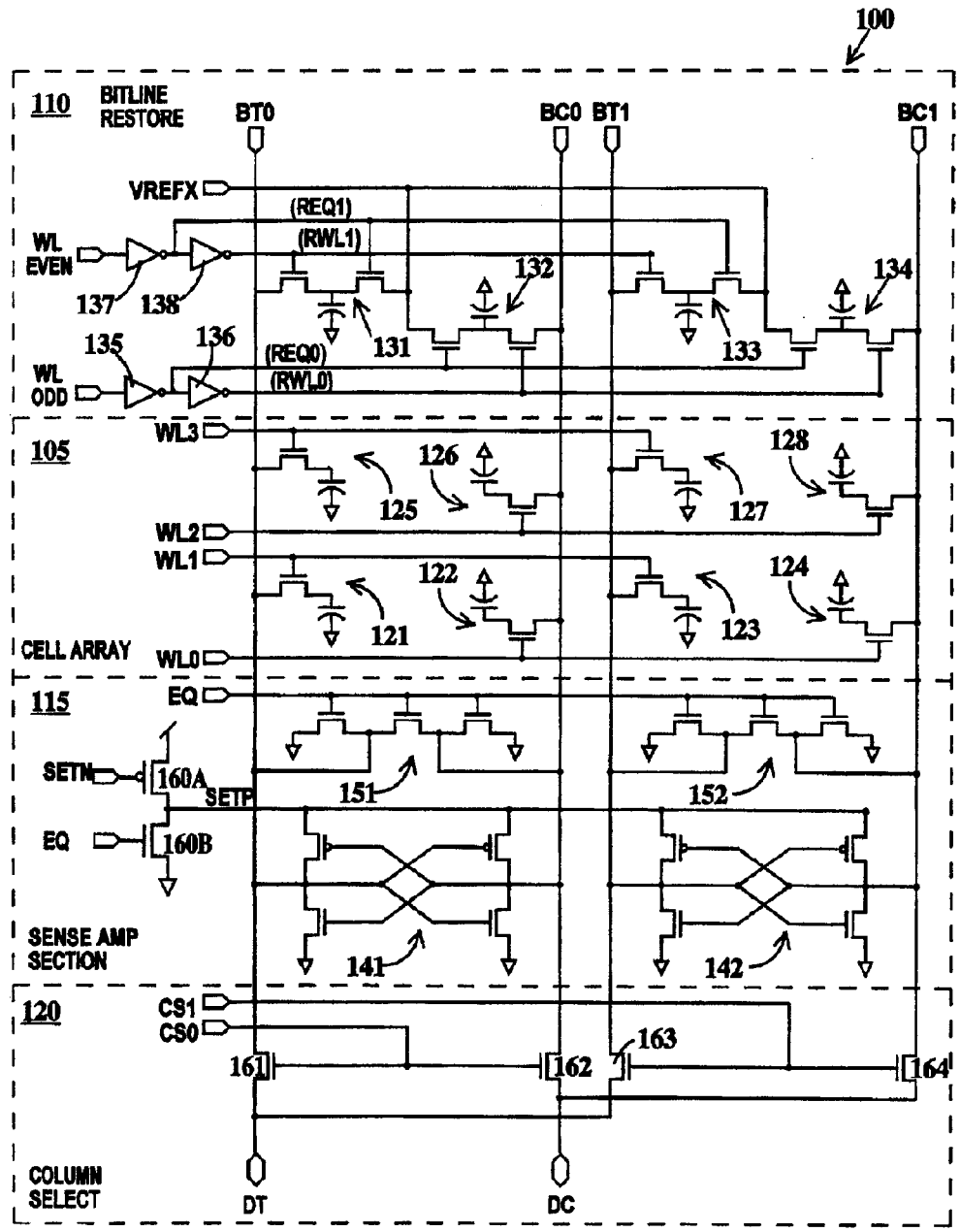
FIG. 1 is an exemplary schematic circuit diagram of an eDRAM array.

FIG. 1 is an exemplary schematic circuit diagram of an eDRAM array 100. In FIG. 1, eDRAM array 100 includes a data cell array 105, a reference cell array 110, a sense amplifier section 115 and column select (CS) circuits 120. eDRAM array 100 is a GND restore eDRAM, i.e. the bitlines (BLs) are initialized to GND. For simplicity, eDRAM 100 includes only four wordlines WL0, WL1, WL2 and WL3 and two bitline pairs BT0 and BC0 (true and complement of bitline 0) and BT1 and BC1 (true and complement of bitline 1). In practice, the number of wordlines and bitlines may be any number.

Data cell array 105 includes a first data cell 121 coupled between WL1 and BT0, a second data cell 122 coupled between WL0 and BC0, a third data cell 123 coupled between WL1 and BT1, a fourth data cell 124 coupled between WL0 and BC1, a fifth data cell 125 coupled between WL3 and BT0, a sixth data cell 126 coupled between WL2 and BC0, a seventh data cell 127 coupled between WL3 and BT1 and an eighth data cell 128 coupled between WL2 and BC1. Each data cell 121 through 128 includes an NFET and a storage capacitor. The first source/drain of each NFET is coupled to that data cells respective bitline and the second source/drain of the NFET to a first plate of the capacitor. The second plate of each storage capacitor is coupled to ground and the gate of each NFET is coupled to that data cells respective wordline.

Reference cell array 110 includes a first reference cell 131, a second reference cell 132, a third reference cell 133 and a fourth reference cell 134. The number of reference cells is equal to the number of bitlines in eDRAM array 100. Reference cells 131 through 134 each include a first NFET, a second NFET and a storage capacitor.

For each reference cell 131 through 134, the first source drain of each NFET and the first plate of the storage capacitor share a common node and the second plate of the storage capacitor is coupled to ground.

For second reference cell 132, the second source/drain of the first NFET is coupled to BC0 and the gate of the first NFET is coupled to a first reference wordline (RWL0). The second source/drain of the second NFET is coupled to $V_{REFX}$ and the gate of the second NFET is coupled to a first reference equalize signal line (REQ0).

For first reference cell 131, the second source/drain of the first NFET is coupled to BT0 and the gate of the first NFET is coupled to a second reference wordline (RWL1). The second source/drain of the second NFET is coupled to $V_{REFX}$ and the gate of the second NFET is coupled to a second reference equalize signal line (REQ1).

For fourth reference cell 134, the second source/drain of the first NFET is coupled to BC1 and the gate of the first NFET is coupled to RWL0. The second source/drain of the second NFET is coupled to $V_{REFX}$ and the gate of the second NFET is coupled to REQ0.

For third reference cell 133, the second source/drain of the first NFET is coupled to BT1 and the gate of the first NFET is coupled to RWL1. The second source/drain of the second NFET is coupled to $V_{REFX}$ and the gate of the second NFET is coupled to REQ1.

Reference cells transfer charge to the bitline of each bitline pair that is not being actively written to or read out. For example, if BT0 is being read, then BC0 is coupled to reference cell 132.

The signal on REQ0 is generated by inversion of a WL ODD signal by inverter 135. The signal on RWL0 is generated by inversion of the inverted WL ODD signal by inverter 136. The signal on REQ1 is generated by inversion of the a WL EVEN signal by inverter 137. The RWL1 signal is generated by inversion the inverted WL EVEN signal by inverter 138. WL ODD is active when any odd numbered wordline is active, in this example WL1 or WL3. WL EVEN is active when any even numbered wordline is active, in this example WL0 or WL2. There are only two reference wordlines, RWL1 representing odd numbered wordlines in data cell array 105 and RWL0 representing even numbered wordlines in data cell array 105.

Sense amplifier (SA) section 115 includes a first sense amplifier 141, a second sense amplifier 142, a first bitline restore circuit 151 and second bitline restore circuit 152. The number of sense amplifiers and bitline restore circuits is equal to the number bitline pairs in eDRAM array 100.

In the present example, sense amplifiers 141 and 142 are common cross-coupled amplifiers. Each sense amplifier 141 and 142 includes two PFET/NFET stacks, each PFET/NFET stack having a common node (where the drain of the NFET couples to the drain of the PFET). The gates of the NFET and the PFET of the each stack are coupled to each other and cross-coupled to the common node of the other stack.

For both first sense amplifier 141 and second sense amplifier 142, the sources of the PFETS are coupled to a sense amplifier enable line (SETP) and the source of the NFETS are coupled to ground. For first sense amplifier 141, the common node of the first NFET/PFET stack is coupled to BT0 and the common node of the second NFET/PFET stack is coupled to BC0. For second sense amplifier 142, the common node of the first NFET/PFET stack is coupled to BT1 and the common node of the second NFET/PFET stack is coupled to BC1.

The signal on SETP is generated by transistors 160A and 160B in response to a sense amplifier enable signal (SETN) low which will bring SETP high or an equalize signal (EQ) high which will bring SETP low. (During equalization, the BT and BC lines of a bitline pair are shunted together.) With SETP low, there is no amplification of the signals on any of the bitlines.

First and second restore circuits 151 and 152 each include three NFETs in series, the gates of each NFET coupled to a signal line carrying EQ. For each restore circuit 151 and 152, the source of the first NFET and source of the third NFET are coupled to ground. For first restore circuit 151, a first source/drain of the second NFET is coupled to the drain of the first NFET and to BT0. A second source/drain of the second NFET is coupled to the drain of the third NFET and to BC0. For second restore circuit 152, a first source/drain of the second NFET is coupled to the drain of the first NFET and to BT1. A second source/drain of the second NFET is coupled to the drain of the third NFET and to BC1. When EQ is high bitlines BT0, BC0, BT1 and BC1 are pulled low and the second NFET equalizes the true and complement of each bitline.

Column select circuits 120 are comprised of one NFET for each bitline, each NFET acting to gate the output of that bitline. In the present example, there are four NFETs 161, 162, 163 and 164. A first source/drain of NFET 161 is coupled to BT0 and a second source/drain of NFET 161 is coupled to an input/output node, data true (DT), of eDRAM array 100. A first source/drain of NFET 162 is coupled to BC0 and a second source/drain of NFET 162 is coupled to an input/output node, data compliment (DC), of eDRAM array 100. The gates of NFETS 161 and 162 are coupled to a column select zero signal line (CS0). A first source/drain of NFET 163 is coupled to BT1 and a second source/drain of NFET 163 is coupled to DT. A first source/drain of NFET 164 is coupled to BC1 and a second source/drain of NFET 164 is coupled to DC. The gates of NFETS 163 and 164 are coupled to a column select zero signal line (CS1). There is one column select line for each bitline pair in eDRAM array 100. Thus, NFETs 161, 162, 163 and 164 act as bit switches, gating input and output through nodes DT and DC.

An eDRAM is written or read by bringing a selected wordline high to transfer the charge stored in all cells coupled to that wordline to the bitlines. The sense amplifiers amplify this small amount of charge and the column select connect the amplified signals to read/write data path devices corresponding to the activated column select devices. The restore circuit precharges the bitlines after the sense amplifiers are turned off.

Figure 2:
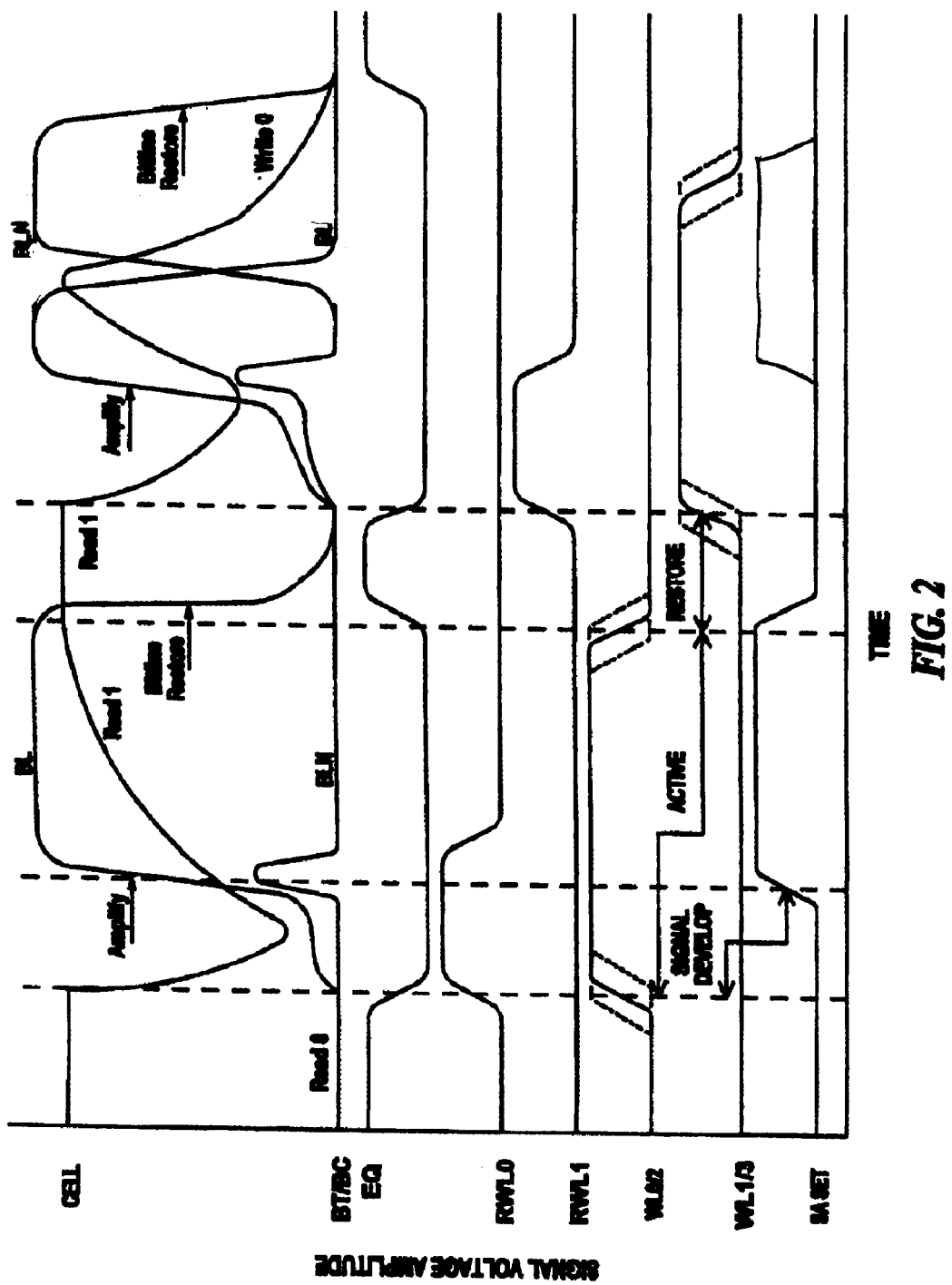
FIG. 2 is a timing diagram for the e-eDRAM of FIG. 1.

FIG. 2 is a timing diagram for the eDRAM of FIG. 1. The timings sequence in eDRAM array 100 (see FIG. 1) during the active portion of the cycle are (1) transfer the charge from the cell onto the bitline(s), (2) amplify the charge on the bitline(s) and (3) write back charge to the cell. The timings sequence in eDRAM array 100 (see FIG. 1) during the restore (or precharge) portion of the cycle are (1) deselect wordlines; (2) turn off the sense amplifiers and (3) equalize the bitline(s) and precharge the bitlines(s) to GND before the start of the next read cycle. Since all timings are synchronized with the WL0/2 or WL1/3 signals, jitter (indicated the dashed lines) in WL0/2 and WL1/3 signals can shorten or lengthen the duration of the active period and the restore period. Jitter is the uncertainty in the timing (or clocking) of a signal edge. Referencing the CELL signal, if the active period is too short, then not enough charge will be written back to the cell and if the active period is too long, the EQ signal will not be long enough to bring both BC and BT to the same voltage value and a differential voltage will exist on the bitline pair that must be overcome by the sense amplifiers on the next cycle.

Figure 3:
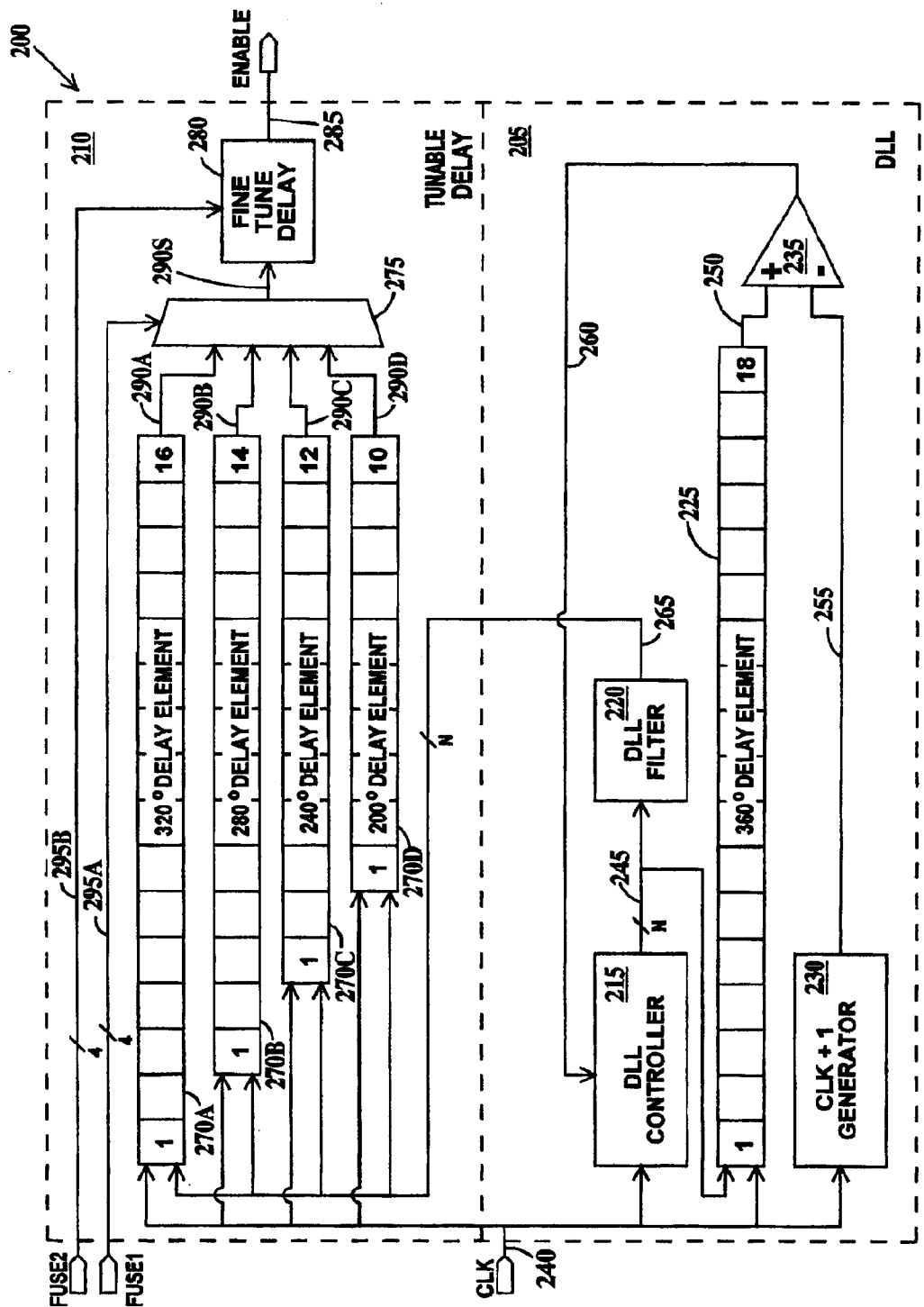
FIG. 3 is a block schematic diagram of a circuit for precise timing control of the start of the restore period of the eDRAM of FIG. 1 according to a first embodiment of the present invention.

FIG. 3 is a block schematic diagram of a circuit for precise timing control of the start of the restore period of the eDRAM of FIG. 1 according to a first embodiment of the present invention. In FIG. 3, a tunable timing circuit 200 includes a delayed lock loop (DLL) circuit 205 and a tunable delay circuit 210. DLL circuit 205 includes a DLL controller 215, a DLL filter 220, a 360° delay element 225, a clock-plus-one generator 230 and a comparator 235. DLL controller 215, delay element 225 and clock-plus-one generator 230 all receive a CLK signal 240 from an external source. DLL controller generates a control signal 245, which is a word N-bits wide and is synchronous with CLK signal 240. Control signal 245 is received by delay element 225 and LL filter 220. DLL element 225 includes, in the present example, 18 delay stages (more or less stages may be used), each delay stage responsive to control signal 245. Each stage is capable of adding to CLK signal 240 a 20° delay +/− an adjustable amount of delay responsive to control signal 245. DLL element 225 is described in more detail infra with reference to FIG. 4. The output of delay element 225 is coupled to a first input or comparator 235 and is a delayed CLK signal 250, whose exact phase relative to the phase of CLK signal 240 is a function of control signal 245. The output of clock-plus-one generator 230 is a shifted CLK signal 255, which is shifted from CLK signal 240 by a whole phase or 360° and which is coupled to a second input of comparator 235. Comparator 235 determines which of the phase of shifted CLK signal 255 or delayed CLK signal 250 is greater and generates a single-bit add/subtract delay signal 260. Add/subtract delay signal 260 is coupled to DLL controller 215 and is used by the DLL controller to modify control signal 245 in order to add or remove adjustable delay from the delay stages of delay element 225. DLL filter 220 filters control signal 245 to remove/reduce jitter in control signal 245 and generates a filtered control signal 265.

Tunable delay circuit 210 includes, in the present example, a 320° delay element 270A having 16 delay stages, a 280° delay element 270B having 14 delay stages, a 240° delay element 270C having 12 delay stages, a 200° delay element 270D having 10 delay stages, a multiplexer 275 and a fine-tune delay circuit 280. Except for the number of delay stages, delay elements 270A to 270D are similar to delay element 225. The phase of a restore enable signal 285 generated by fine-tune delay circuit 280 and base delay on delay elements 270A to 270D. Delay elements 270A to 270D are coupled to CLK signal 240 and filtered control signal 265 and generate delayed CLK signals 290A to 290D, which are coupled to multiplexer 275. In response to FUSE1 control signals 295A (which in the present example is a 4-bit word), multiplexer 275 selects one of delayed CLK signals 290A to 290D and couples the selected delayed CLK signal, designated course enable signal 290S, to fine-tune delay circuit 280. Fine-tune delay circuit 280, in response to FUSE2 control signals 295B further tunes delayed CLK signal 290S to generate restore enable signal 285.

The following example illustrates the effect of tunable timing circuit 200. Assume CLK signal 240 is a 100MHz (or 10 nano-seconds (ns)) signal. If delay signal 290D is selected by multiplexer 275, the phase course enable 290S will be 200° out of phase from CLK signal 240 or lag behind by (200/360)×10=5.55 ns. If fine-tune delay circuit 280 adds a further 0.02 ns delay, then restore enable signal 285 will be delayed 5.57 ns relative to CLK signal 240.

Returning to FIG. 2, restore enable signal 285 may be used to accurately and precisely time (gate) the turning on/off of wordline signals WL0/2 and WL1/3 of FIG. 2. In other words, restore enable signal 285 can be used to very accurately time the start of the restore period of an eDRAM cycle since all signals, CELL, BT/BC EQ, RWL0, RWL1, WL0/2 and WL1/3 are synchronous and derived from the same CLK signal 240 (see FIG. 3). The present invention has the advantages that since DLL phase generators do not vary with process, voltage or temperature, thus changes in active/restore periods of the eDRAM cycle will also not vary with these parameters when driven by restore enable signal 285. Control of active/restore cycles is not a function of CLK 240 duty cycle and further, jitter can be controlled to less than 50 pico-seconds (ps).

FIG. 4 is a schematic diagram of an exemplary delay element of the circuit of FIG.3. In FIG. 4, delay element 225 includes delay stages 300A to 300Q. In the present example, there are 18 delay stages. Each delay stage 300A to 300Q includes an inverter 305, four capacitors 310A to 310D having respective capacitive values of C1, C2, C3 and C4 where C1<C2<C3<C4 and four corresponding NFETs 315A to 315D acting as pass gates. The drain of each NFET 315A is coupled to a node 320 connecting the output of a previous inverter 305 to the input of a subsequent inverter. The source of NFET 315A is coupled to GND through capacitor 310A, the source of NFET 315B is coupled to GND through capacitor 310B, the source of NFET 315C is coupled to GND through capacitor 310C, The source of NFET 315D is coupled to GND through capacitor 310D. The gate of each NFET 315A, 315B, 315C and 315D is coupled to different respective bits N0, N1, N2 and N3 of control signal 245. If a particular bit N0 to N3 is on (high), then the corresponding capacitor 310A to 310D is coupled to node 320, increasing the delay through each stage 300A to 300Q. The primary delay through each stage 300A to 300Q is due to inverters 305. In the present example, there are $2^4$ possible delay settings possible.

If delay element 225 is nominally designed as a 360° phase delay element, then both positive and negative adjustment is possible by designing the nominal delay with one or more bits N0 to N4 expected to be on (high). Thus, some capacitive loading is included in the 20° phase shift of each stage 300A to 300Q and by turning off (bit low) particular bits, less than 20° phase delay will be realized through each delay stage (for the same clock cycle, voltage, process and temperature) and by turning on particular bits (bit high)

more less than 20° phase delay will be realized through each delay stage. It should be pointed out 18 delay stages and four NFET/capacitor pairs per stage is exemplary and that the more delay stages and the more NFET/capacitor pairs (an bits in control signal 245) the more granularity of control will be realized. Delay elements 290A to 290D of FIG. 3 are similar to delay element 225, only the number of delay stages and the total delay through the respective delay elements being different. Because filtered control signal 265 (derived from control signal 245, see FIG. 3) is also four-bits, then there are four NFET/capacitor pairs in each stage of each delay element 290A to 290D.

FIG. 5 is a schematic diagram of an exemplary fine-tuning circuit of the circuit of FIG. 3. In FIG. 5, fine-tune delay circuit 280 includes four inverter banks 325A, 325B, 325C and 325D, each inverter bank coupled between course enable signal 290S and a de-multiplexer 330. The output of multiplexer 330 is restore enable signal 285. Multiplexer 330 is responsive to FUSE2 control signals 295B. Inverter bank 325A comprises two inverters |1 and |2 connected in series, inverter bank 325B comprises four inverters |3, |4, |5 and |6 connected in series, inverter bank 325C comprises six inverters |7, |8, |9, |10, |11 and |12 connected in series and inverter bank 325D comprises eight inverters |13, |14, |15, |16, |17, |18, |19 and |20 connected in series. By selection of various combinations of inverter banks 325A to 325D, small increases or decreases to the phase of course enable signal 290S are realized in restore enable signal 285. There are four inverter banks 325A, 325B, 325C and 325D because FUSE2 control signal 295B is a four-bit control word. More or less bits and a corresponding number of inverter banks may be used.

FIG. 6 is a schematic diagram of an exemplary fuse bank circuit 335 for generating control signals for the circuit of FIG. 3. In FIG. 6, fuse bank circuit 335 includes a four-bit shift register 340 having a first stage 345A, a second stage 345B, a third stage 345C and a fourth stage 345D, a first fuses 350A, a second fuse 350B, a third fuse 350C and a fourth fuse 350D and a first multiplexer 355A, a second multiplexer 355B, a third multiplexer 355C and a fourth multiplexer 355D. First stage 345A of shift register 340 and first fuse 350A are coupled to inputs of first multiplexer 355A. The output of first multiplexer 355A is an F0 bit of FUSE1 (or FUSE2) control signal 295A (or 295B). Second stage 345B of shift register 340 and second fuse 350B are coupled to inputs of second multiplexer 355B. The output of the second multiplexer 355B is an F1 bit of FUSE1 (or FUSE2) control signal 295A (or 295B). Third stage 345C of shift register 340 and third fuse 350C are coupled to inputs of third multiplexer 355C. The output of third multiplexer 345C is an F2 bit of FUSE1 (or FUSE2) control signal 295A (or 295B). Fourth stage 345D of shift register 340 and fourth fuse 350D are coupled to inputs of fourth multiplexer 355D. The output of fourth multiplexer 355D is an F3 bit of FUSE1 (or FUSE2) control signal 295A (or 295B). Shift register 340 is a typical level sensitive scan design (LSSD) register.

The pattern of fuses 350A, 350B, 350C and 350D to blow is determined during test of the eDRAM 100 (see FIG. 1). A test pattern is scanned into shift register 340 to simulate a fuse blow pattern and the performance or other parameters of the eDRAM are measured. For example, the tester could determine which pattern gives the highest yield or which pattern gives the fastest eDRAM. The fuses are then blown to this pattern. Each eDRAM on a single chip on a wafer may be individually tested and appropriate fuses blown. Alternatively, a representative number of eDRAMs on several chips on a wafer may be tested, and an "average" pattern selected for blowing the same fuses on all eDRAMs on all chips. Or a representative number of eDRAMs on several chips on several wafers may be tested, and an "average" pattern selected for blowing the same fuses on all eDRAMs on all chips on all wafers in a lot (group of wafers processed together).

Fuses 350A, 350B, 350C and 350D may be laser blow fuses, electrical blow fuses or electrical blow antifuses. More or less than four fuses may be used depending upon the number of delay elements in tunable delay circuit 210 (see FIG. 3) and inverter banks in fine-tune delay circuit 280 (see FIG. 5).

Optionally, two separate fuse bank circuits 335 may be replaced with a single fuse bank circuit having an eight-bit shift register with two banks of four fuses each in order to share a scan chain.

The present invention is extendable beyond control of just the restore (precharge) period of an eDRAM to any or all of the synchronous control signals or functions of an eDRAM describes supra.

Figure 7:
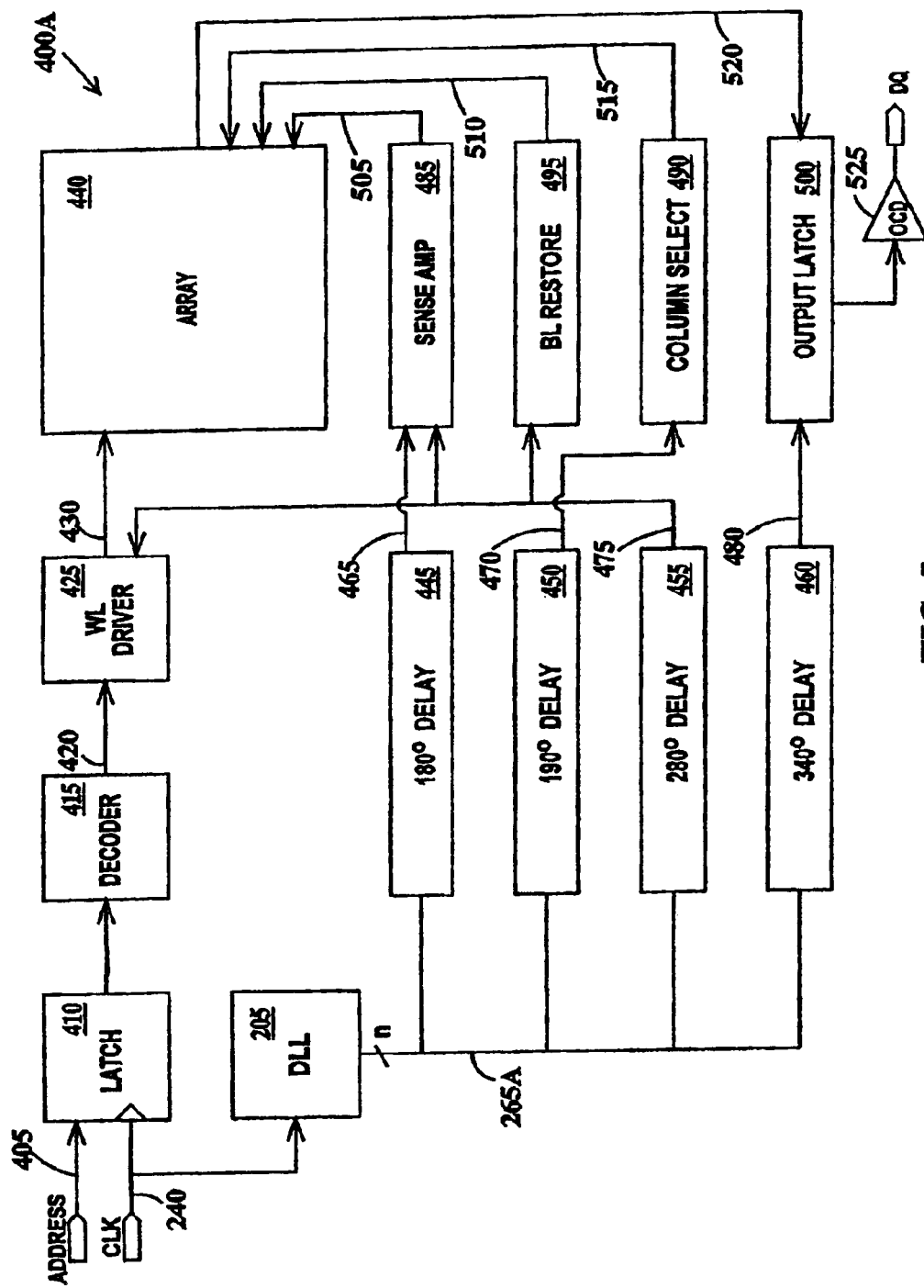
FIG. 7 is a block schematic diagram of an eDRAM according to a second embodiment of the present invention.

FIG. 7 is a block schematic diagram of an eDRAM 400A according to a second embodiment of the present invention. In FIG. 7, eDRAM 400A includes a latch receiving an address signal 405 and CLK signal 240. Address signal 405 is received by a latch 410 and decoded by a decoder 415 which generates a wordline select signal 420 received by a wordline driver 425 which generates a wordline signal 430 received by a memory array 440. CLK signal 240 is also received by DLL circuit 205, which generates a filtered control signal 265A. Filtered control signal 265A is similar to filtered control signal 265 (see FIG. 3) except that filtered control signal 265A is an n-bit word, where n is any positive whole number. Filtered control signal 265A is received by a first, a second, a third and a fourth delay elements 445, 450, 455 and 460 which generate a SA set enable signal 465, a CS enable signal 470, a BL restore enable signal 475 and an output enable signal 480 respectively. First, second, third and fourth delay elements 445, 450, 455 and 460 are similar to delay elements 290A to 290D illustrated in FIG. 3 and described supra, except the phase shifts are different.

In the present example, first delay element 445 has a 180° delay, second delay element 450 has a 190° delay, third delay element 455 has a 280° delay and fourth delay element 460 has a 340° delay. First delay element 445 has a lesser delay than second delay element 450, which has a lesser delay than third delay element 455, which has a lesser delay than fourth delay element 460, otherwise eDRAM 400 will not function properly. In the second embodiment of the present invention the delays of delay elements 445, 450, 455 and 460 are fixed and "designed in". SA set enable signal 465 is received by sense amplifier control circuit 485. CS enable signal 470 is received by CS control circuit 490. BL restore enable signal 475 is received by WL driver circuit 425, SA control circuit 485 and BL restore control circuit 495. Output enable signal 480 is received by and output latch 500. SA control circuit 485 generates a SA set signal 505 received by memory array 440. BL restore control circuit 495 generates a BL restore signal (EQ signal) 510 received by memory array 440. CS control circuit 490 generates a CS signal 515 received by memory array 440. Output latch 500 receives data 520 from memory array 440 and sends the data to OCD 525.

Figure 8:
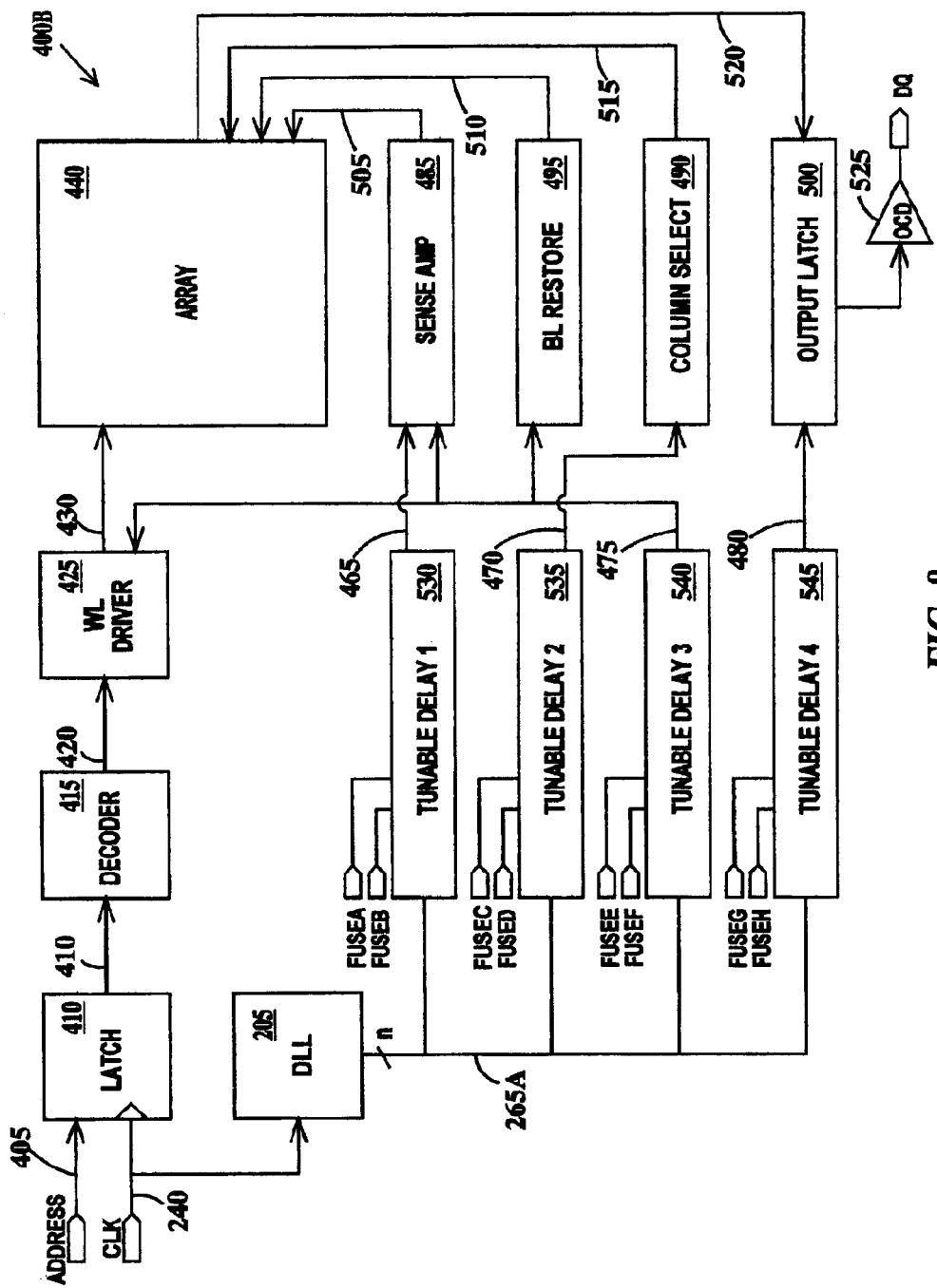
FIG. 8 is a block schematic diagram of an eDRAM according to a third embodiment of the present invention.

FIG. 8 is a block schematic diagram of an eDRAM 400B according to a third embodiment of the present invention. In FIG. 8, eDRAM 400B is similar to eDRAM 400A of FIG. 7, except that first, second, third and fourth fixed delay elements 445, 450, 455 and 460 of eDRAM 400A are replaced respectively by first, second, third and fourth tunable delay circuits 530, 535, 540 and 545 respectively in eDRAM 400B. First, second, third and fourth tunable delay circuits 530, 535, 540 and 545 are similar to tunable delay circuit 210 illustrated in FIG. 3 and described supra. The delay of first tunable delay circuit 530 is "programmed" via signals FUSEA and FUSEB. The delay of second tunable delay circuit 535 is "programmed" via signals FUSEC and FUSED. The delay of third tunable delay circuit 540 is "programmed" via signals FUSEE and FUSEF. The delay of fourth tunable delay circuit 545 is "programmed" via signals FUSEG and FUSEH.

The description of the embodiments of the present invention is given above for the understanding of the present invention. It will be understood that the invention is not limited to the particular embodiments described herein, but is capable of various modifications, rearrangements and substitutions as will now become apparent to those skilled in the art without departing from the scope of the invention. Therefore, it is intended that the following claims cover all such modifications and changes as fall within the true spirit and scope of the invention.

What is claimed is:

1. A circuit for timing the start of a precharge period in an eDRAM comprising:
   a delayed lock loop circuit for receiving a clock signal and generating a control signal for adjusting an internal delay of said clock signal; and
   means for generating a delayed clock signal in response to said control signal.

2. The circuit of claim 1, wherein said means for generating said delayed clock signal is a multiple stage delay circuit, each stage of said multiple delay stage circuit connected in series and each stage individually responsive to said control signal.

3. The circuit of claim 2, wherein each stage includes a inverter having an input and an output and a multiplicity of capacitors connectable between said output of said inverter and ground by pass gates; each pass gate responsive to a different bit of said control signal.

4. The circuit of claim 2, further including means for further delaying said delayed clock signal in response to a fuse signal generated by a fuse bank circuit based on a pattern of blown and un-blown fuses in a fuse bank.

5. The circuit of claim 1 wherein said means for generating said delayed clock signal is a set of multiple stage delay circuits and includes means for selecting one of said multiple stage delay circuits, each multiple delay stage circuit having a different base delay, each stage of each multiple delay stage circuit connected in series and each stage of each multiple delay stage circuit individually responsive to said control signal, said means for selecting responsive to a fuse signal generated by a fuse bank circuit based on a pattern of blown and un-blown fuses in a fuse bank.

6. The circuit of claim 5, wherein each delay stage includes a inverter having an input and an output and a multiplicity of capacitors connectable between said output of said inverter and ground by pass gates, each pass gate responsive to a different bit of said control signal.

7. The circuit of claim 5, further including means for further delaying said delayed clock signal in response to an additional fuse signal generated by an additional fuse bank circuit based on a pattern of blown and un-blown fuses in an additional fuse bank.

8. The circuit of claim 1, wherein said delayed clock signal enables the start of said precharge period of said eDRAM.

9. A method for timing the start of a precharge period in an eDRAM comprising:
   providing a delayed lock loop circuit for receiving a clock signal and generating a control signal for adjusting an internal delay of said clock signal; and
   providing means for generating a delayed clock signal in response to said control signal.

10. The method of claim 9, wherein said means for generating said delayed clock signal is a multiple stage delay circuit, each stage of said multiple delay stage circuit connected in series and each stage individually responsive to said control signal.

11. The method of claim 10, wherein each stage includes a inverter having an input and an output and a multiplicity of capacitors connectable between said output of said inverter and ground by pass gates; each pass gate responsive to a different bit of said control signal.

12. The method of claim 10, further including further delaying said delayed clock signal in response to a fuse signal generated by a fuse bank circuit based on a pattern of blown and un-blown fuses in a fuse bank.

13. The method of claim 9, wherein said means for generating said delayed clock signal is a set of multiple stage delay circuits and includes means for selecting one of said multiple stage delay circuits, each multiple delay stage circuit having a different base delay, each stage of each multiple delay stage circuit connected in series and each stage of each multiple delay stage circuit individually responsive to said control signal, said means for selecting responsive to a fuse signal generated by a fuse bank circuit based on a pattern of blown and un-blown fuses in a fuse bank.

14. The method of claim 13, wherein each stage includes a inverter having an input and an output and a multiplicity of capacitors connectable between said output of said inverter and ground by pass gates; each pass gate responsive to a different bit of said control signal.

15. The method of claim 13, further including delaying said delayed clock signal in response to an additional fuse signal generated by an additional fuse bank circuit based on a pattern of blown and un-blown fuses in an additional fuse bank.

16. The method of claim 15, wherein said pattern of blown and un-blown fuses and said additional pattern of blown and un-blown fuses is determined by scanning in test patterns into a scan chain coupled to said fuse bank and said additional fuse bank and measuring the performance of said eDRAM.

17. The method of claim 1, wherein said delayed clock signal enables the start of said precharge period in said eDRAM.

18. An eDRAM comprising:
   an array of memory cells interconnected by wordlines and bitlines;
   a delayed lock loop circuit for receiving a clock signal and generating a control signal for adjusting an internal delay of said clock signal;
   means for generating first, second, third and fourth delayed clock signals in response to said control signal;
   a wordline driver for activating wordlines in said eDRAM in response to an address signal, said wordline driver responsive to said third delayed clock signal;
   a sense amplifier circuit for amplifying data signals on said bitlines, said sense amplifier circuit responsive to said first delayed clock signal and said second delayed clock signal;

a bitline precharge circuit for precharging said bitlines, said bitline precharge circuit responsive to said third delayed clock ; and a column select circuit for selecting particular bitlines to connect to means for outputting data signals from said array, said column select circuit responsive to said second delayed clock signal and said means for outputting data signals responsive to said fourth delayed clock signal.

19. The circuit of claim 18, wherein said means for generating said first, second, third and fourth delayed clock signals are multiple stage delay circuits, each stage of each multiple delay stage circuit connected in series and each stage individually responsive to said control signal.

20. The circuit of claim 19, wherein each stage includes a inverter having an input and an output and a multiplicity of capacitors connectable between said output of said inverter and ground by pass gates, each pass gate responsive to a different bit of said control signal.

21. The circuit of claim 18, wherein said fourth delayed clock signal is delayed more than said third delayed clock signal, said third delayed clock signal is delayed more than said second delayed clock signal and second delayed clock signal is delayed more than said first delayed clock signal.

22. The circuit of claim 18, wherein said means for generating said first, second, third and fourth delayed clock signals comprises:

a first set of multiple stage delay circuits and first means for selecting one of said multiple stage delay circuits, each multiple delay stage circuit having a different base delay, each stage of each multiple delay stage circuit connected in series and each stage of each multiple delay stage circuit individually responsive to said control signal, said means for selecting responsive to a first fuse signal generated by a first fuse bank circuit based on a pattern of blown and un-blown fuses in a first fuse bank;

a second set of multiple stage delay circuits and second means for selecting one of said multiple stage delay circuits, each multiple delay stage circuit having a different base delay, each stage of each multiple delay stage circuit connected in series and each stage of each multiple delay stage circuit individually responsive to said control signal, said means for selecting responsive to a second fuse signal generated by a second fuse bank circuit based on a pattern of blown and un-blown fuses in a second fuse bank;

a third set of multiple stage delay circuits and third means for selecting one of said multiple stage delay circuits, each multiple delay stage circuit having a different base delay, each stage of each multiple delay stage circuit connected in series and each stage of each multiple delay stage circuit individually responsive to said control signal, said means for selecting responsive to a third fuse signal generated by a third fuse bank circuit based on a pattern of blown and un-blown fuses in a third fuse bank; and a fourth set of multiple stage delay circuits and fourth means for selecting one of said multiple stage delay circuits, each multiple delay stage circuit having a different base delay, each stage of each multiple delay stage circuit connected in series and each stage of each multiple delay stage circuit individually responsive to said control signal, said means for selecting responsive to a fourth fuse signal generated by a fourth fuse bank circuit based on a pattern of blown and un-blown fuses in a fourth fuse bank.

23. The circuit of claim 18, further including:

first means for further delaying said first delayed clock signal in response to a first additional fuse signal generated by a first additional fuse bank circuit based on a pattern of blown and un-blown fuses in a first additional fuse bank;

second means for further delaying said second delayed clock signal in response to a second additional fuse signal generated by a second additional fuse bank circuit based on a pattern of blown and un-blown fuses in a second additional fuse bank;

third means for further delaying said third delayed clock signal in response to a third additional fuse signal generated by a third additional fuse bank circuit based on a pattern of blown and un-blown fuses in a third additional fuse bank; and fourth means for further delaying said fourth delayed clock signal in response to a fourth additional fuse signal generated by a fourth additional fuse bank circuit based on a pattern of blown and un-blown fuses in a fourth additional fuse bank.

24. A method of synchronous control of an eDRAM comprising an array of memory cells interconnected by wordlines and bitlines, said method comprising:

providing a delayed lock loop circuit for receiving a clock signal and generating a control signal for adjusting an internal delay of said clock signal;

providing means for generating first, second, third and fourth delayed clock signals in response to said control signal;

providing a wordline driver for activating wordlines in said eDRAM in response to an address signal, said wordline driver responsive to said third delayed clock signal;

providing a sense amplifier circuit for amplifying data signals on said bitlines, said sense amplifier circuit responsive to said first delayed clock signal and said second delayed clock signal;

providing a bitline precharge circuit for precharging said bitlines, said bitline precharge circuit responsive to said third delayed clock ; and providing a column select circuit for selecting particular bitlines to connect to means for outputting data signals from said array, said column select circuit responsive to said second delayed clock signal and said means for outputting data signals responsive to said fourth delayed clock signal.

25. The method of claim 24, wherein said means for generating said first, second, third and fourth delayed clock signals are multiple stage delay circuits, each stage of each multiple delay stage circuit connected in series and each stage individually responsive to said control signal.

26. The method of claim 25, wherein each stage includes a inverter having an input and an output and a multiplicity of capacitors connectable between said output of said inverter and ground by pass gates, each pass gate responsive to a different bit of said control signal.

27. The method of claim 24, wherein said fourth delayed clock signals is delayed more than said third delayed clock signal, said third delayed clock signals is delayed more than said second delayed clock signal and second delayed clock signals is delayed more than said first delayed clock signal.

28. The method of claim 24, wherein said means for generating said first, second, third and fourth delayed clock signals comprises:

a first set of multiple stage delay circuits and first means for selecting one of said multiple stage delay circuits, each multiple delay stage circuit having a different base delay, each stage of each multiple delay stage circuit connected in series and each stage of each multiple delay stage circuit individually responsive to said control signal, said means for selecting responsive to a first fuse signal generated by a first fuse bank circuit based on a pattern of blown and un-blown fuses in a first fuse bank;

a second set of multiple stage delay circuits and second means for selecting one of said multiple stage delay circuits, each multiple delay stage circuit having a different base delay, each stage of each multiple delay stage circuit connected in series and each stage of each multiple delay stage circuit individually responsive to said control signal, said means for selecting responsive to a second fuse signal generated by a second fuse bank circuit based on a pattern of blown and un-blown fuses in a second fuse bank;

a third set of multiple stage delay circuits and third means for selecting one of said multiple stage delay circuits, each multiple delay stage circuit having a different base delay, each stage of each multiple delay stage circuit connected in series and each stage of each multiple delay stage circuit individually responsive to said control signal, said means for selecting responsive to a third fuse signal generated by a third fuse bank circuit based on a pattern of blown and un-blown fuses in a third fuse bank; and a fourth set of multiple stage delay circuits and fourth means for selecting one of said multiple stage delay circuits, each multiple delay stage circuit having a different base delay, each stage of each multiple delay stage circuit connected in series and each stage of each multiple delay stage circuit individually responsive to said control signal, said means for selecting responsive to a fourth fuse signal generated by a fourth fuse bank circuit based on a pattern of blown and un-blown fuses in a fourth fuse bank.

29. The method of claim 24, further including:

further delaying said first delayed clock signal in response to a first additional fuse signal generated by a first additional fuse bank circuit based on a pattern of blown and un-blown fuses in a first additional fuse bank;

further delaying said second delayed clock signal in response to a second additional fuse signal generated by a second additional fuse bank circuit based on a pattern of blown and un-blown fuses in a second additional fuse bank;

further delaying said third delayed clock signal in response to a third additional fuse signal generated by a third additional fuse bank circuit based on a pattern of blown and un-blown fuses in a third additional fuse bank; and further delaying said fourth delayed clock signal in response to a fourth additional fuse signal generated by a fourth additional fuse bank circuit based on a pattern of blown and un-blown fuses in a fourth additional fuse bank.

30. The method of claim 29, wherein said first, second, third and fourth patterns of blown and un-blown fuses and said first, second, third and fourth additional patterns of blown and un-blown fuses are determined by scanning in test patterns into scan chains coupled to said first, second, third and fourth fuse banks and said first, second, third and fourth additional fuse bank and measuring the performance of said eDRAM.

* * * * *